United States Patent
Calafut et al.

[11] Patent Number: 6,153,473
[45] Date of Patent: Nov. 28, 2000

[54] METHOD OF SYMMETRICALLY IMPLANTED PUNCH-THROUGH STOPPER FOR A RUGGED DMOS POWER DEVICE

[75] Inventors: Daniel S. Calafut, Sunnyvale; Steven P. Sapp, Felton, both of Calif.

[73] Assignee: National Semiconductor Corporation, Santa Clara, Calif.

[21] Appl. No.: 09/170,920

[22] Filed: Oct. 13, 1998

Related U.S. Application Data

[62] Division of application No. 08/990,141, Dec. 12, 1997, abandoned.

[51] Int. Cl.$^7$ .................................................. H01L 21/336
[52] U.S. Cl. ........................... 438/268; 438/133; 438/273; 438/289; 438/290; 438/291
[58] Field of Search ..................................... 438/133, 275, 438/268, 289, 290, 291, 138, 217, 273, 274; 148/DIG. 126

[56] References Cited

U.S. PATENT DOCUMENTS

| | | | |
|---|---|---|---|
| 4,231,811 | 11/1980 | Somekh et al. | 148/1.5 |
| 4,502,069 | 2/1985 | Schub | 357/23.4 |
| 4,516,143 | 5/1985 | Love | 357/23.4 |
| 4,598,461 | 7/1986 | Love | 29/571 |
| 4,853,345 | 8/1989 | Himelick | 437/41 |
| 4,879,254 | 11/1989 | Tsuzuki et al. | 437/41 |
| 4,920,064 | 4/1990 | Whight | 437/41 |
| 4,985,740 | 1/1991 | Shenai et al. | 357/23.4 |
| 5,034,336 | 7/1991 | Seki | 437/29 |
| 5,155,052 | 10/1992 | Davies | 437/40 |
| 5,173,435 | 12/1992 | Harada | 437/31 |
| 5,302,537 | 4/1994 | Strack | 437/40 |
| 5,731,604 | 3/1998 | Kinzer | 257/153 |
| 5,795,793 | 8/1998 | Kinzer | 437/41 |

*Primary Examiner*—Long Pham
*Attorney, Agent, or Firm*—Limbach & Limbach L.L.P.

[57] ABSTRACT

A structural enhancement to a conventional DMOS process flow addresses the well-known destructive latch up problem. The additional steps include a symmetric "deep" punch-through stopper implant and additional thermal budget to remove silicon damage and distribute the ionized dopants appropriately. The purpose of the implant is to create a low resistance base region within the parasitic bipolar transistor to prevent the device from activating under high current conditions. In terms of circuit characteristics, the goal is to lower the voltage drop at node Vx in FIG. 1C during avalanche breakdown. This structure also provides a means of suppressing the phenomena of punch-through breakdown which can also lower the device's voltage reading.

1 Claim, 4 Drawing Sheets

6,153,473

METHOD OF SYMMETRICALLY IMPLANTED PUNCH-THROUGH STOPPER FOR A RUGGED DMOS POWER DEVICE

This application is a division of Ser. No. 08/990,141, filing date Oct. 12, 1997 now abn.

BACKGROUND OF THE INVENTION

1. Field of the Invention

The present invention relates to semiconductor circuit elements and, in particular, to use of a symmetric deep implant to provide a punch-through stopper that significantly reduces the possibility of parasitic device turn-on in DMOS power devices.

2. Discussion of the Related Art

Double-diffused Metal Oxide Semiconductor (DMOS) technology is widely used in power device applications.

Typically, in a vertical discrete DMOS device, the substrate forms the drain terminal with the MOSFET built into an epitaxial layer formed on the substrate. However, there are instances, particularly in embedded DMOS applications, where the "substrate" role is played by a buried layer in the integrated circuit substrate. In this case, the substrate can be either p or n type and still support an integrated DMOS device through the buried layer mechanism.

FIG. 1A shows a conventional DMOS device cross-section that includes an n+ buried layer 100, typically formed in a P− substrate (not shown), and an n− epitaxial layer 102 formed on the n+ buried layer 100. The n+/n− layers 100/102 serve as the drain of the vertical DMOS device, with the drain contact (not shown) typically made to the n-epitaxial layer 102. A double diffused p-type body region (or well) 104 serves as the device channel. A gate region that includes a patterned polysilicon gate electrode 106 and underlying gate oxide 107 that separates the polysilicon gate 106 from the channel region 104 form the channel modulating element in the MOSFET structure. The device source is provided by n+ diffusion regions 108. Source regions 108 are contacted by a metal interconnect structure 110 that is insulated from the polysilicon gate material 106 by an intermediate dielectric layer 112, typically borophosphosilicate glass (BPSG).

As discussed by Hu et al., "Second Breakdown of Vertical Power MOSFETs", IEEE, No. 8, August 1982, pp. 1287–1293, one of the problems associated with DMOS technology, when used to drive large inductive loads such as motors or long transmission lines, is that the transient waveforms generated during device operation can activate parasitic elements inherent in this topology and latch the device into destruction.

The FIG. 1A device cross section with key parasitic elements is shown in FIG. 1B; the circuit equivalent is shown in FIG. 1C.

The following could be outlined as a sequence of events leading to DMOS device failure: The device is turned on by a gate voltage which starts current flowing through the circuit. At some point, the device is switched off, thereby providing a high resistance path through the MOSFET. In an ideal case, all currents would cease. However, as mentioned above, in certain applications, a large inductance is associated with the load and its voltage follows the relationship −L di/dt. As a result of forcing a finite current through a virtually infinite resistance, a voltage exceeding the MOSFET breakdown value develops and the device begins to conduct large amounts of current through an avalanche breakdown mechanism. This current sets up internal biases within the device structure, with the result of activating the parasitic bipolar transistor. When this occurs, the MOSFET's maximum standoff voltage, commonly referred to as its breakdown voltage, is reduced by 20–30% and its current conduction becomes uncontrollable leading to thermal runaway and, ultimately, device destruction.

One way to avoid this problem is to "clamp" the inductor voltage externally with some type of rectifier device that turns on during avalanche mode, effectively shunting the inductor current.

Another way, in accordance with the present invention, is to address the problem at the device level. A device designed to avoid the destructive latch up condition described above is said to be "rugged."

SUMMARY OF THE INVENTION

The present invention provides a structural enhancement to a conventional DMOS process flow to address the well-known destructive latch up problem. The additional steps include a symmetric "deep" implant and additional thermal budget to remove silicon damage and distribute the ionized dopants appropriately. The purpose of the implant is to create a low resistance base region within the parasitic bipolar transistor to prevent the device from activating under high current conditions. In terms of circuit characteristics, the goal is to lower the voltage drop at node Vx in FIG. 1C during avalanche breakdown. This structure suppresses the phenomena of punch-through breakdown which can also lower the device's voltage rating.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for fabricating a "rugged" n-channel DMOS power device structure in accordance with the concepts of the present invention will now be described in conjunction with the partial cross-sectional drawings shown in FIGS. 2A–2F. While specific process parameters are not provided in all cases, those skilled in the art will appreciate that the concepts of the invention are applicable regardless of these parameters, which will differ depending upon the specific integrated circuit structure under manufacture. Those skilled in the art will also appreciate that when a specific conventional process step is described, it should be understood that any one of a number of conventional processing techniques may be available to obtain the same result.

Figure 2A:
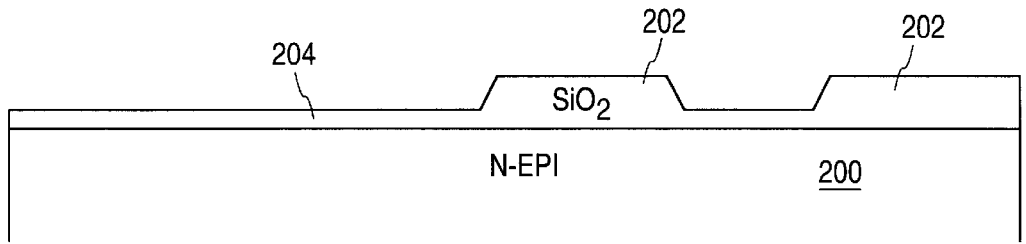
FIGS. 2A–2F are cross-section drawings illustrating a sequence of steps for making a rugged DMOS power device structure in accordance with the present invention.

Referring to FIG. 2A, an embodiment of a fabrication process in accordance with the present invention begins with the formation of an n-epitaxial layer 200 on a semiconductor substrate (not shown), which can be either p-type or n-type material. Next, in accordance with conventional techniques, field oxide isolation regions 202, which are approximately 8,250 Å thick, and gate oxide 204, which is approximately 400 Å thick, are formed on the epitaxial layer 200.

Figure 2B:
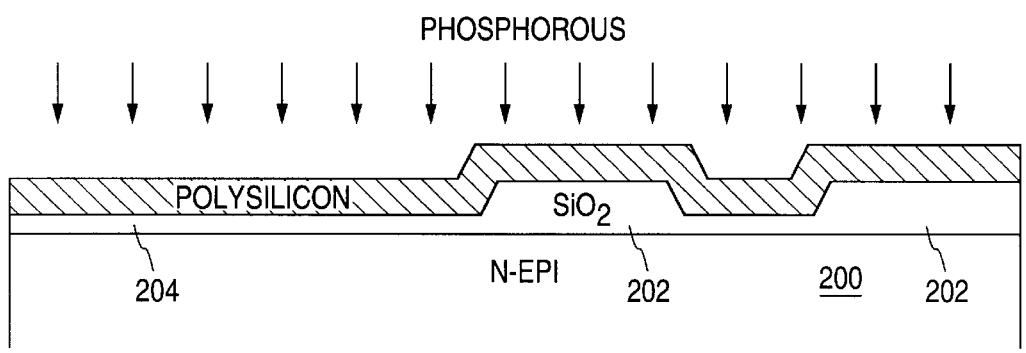
Figure 2C:
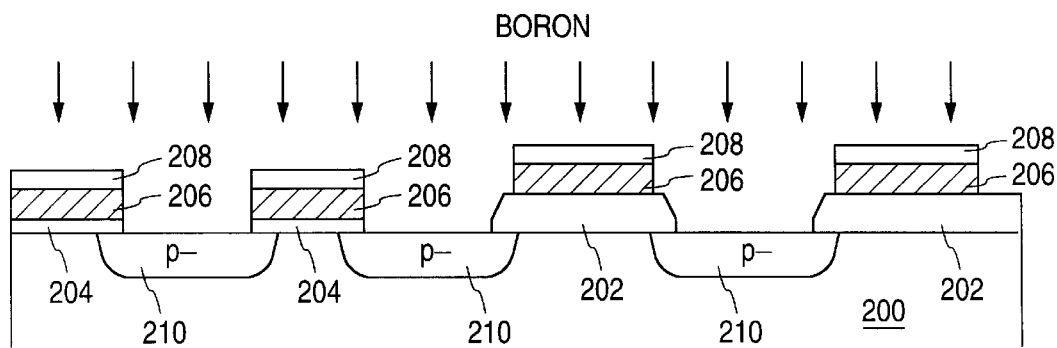

Next, as shown in FIG. 2B, a layer of polysilicon 206 approximately 5,500 Å thick is deposited over the entire structure and doped with n-type dopant, e.g., phosphorus, to a desired conductivity level. The polysilicon is then thermally oxidized to form an overlying layer of silicon dioxide 208. Alternatively, silicon dioxide layer 208 may be formed by chemical vapor deposition (CVD). Referring to FIG. 2C, a photoresist mask (not shown) is then formed on the oxide layer 208 and an anisotropic stacked etch step is performed to expose portions of the n− epitaxial layer 200 by defining polysilicon regions 206 with overlying silicon dioxide 208 and underlying field oxide 202 or gate oxide 204. Boron is then implanted into exposed regions of the epitaxial layer 200 and thermally driven in to define p-well regions 210. Typical peak concentrations for p-well regions 210 range from $8 \times 10^{16}$ to $10^{18}$ atoms per cubic centimeter. The boron is typically introduced at an energy of about 50 to 150 KeV.

Figure 2D:
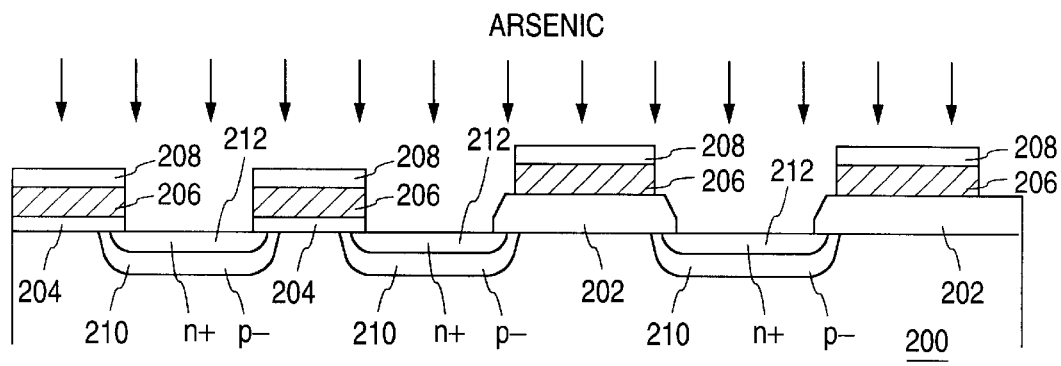

Next, as shown in FIG. 2D, an n-type dopant, such as arsenic, is implanted into the p-well regions 210 to form n+ regions 212 in the p-wells 210. This large dose implant introduces about $5 \times 10^{15}$ atoms per square centimeter.

Figure 2E:
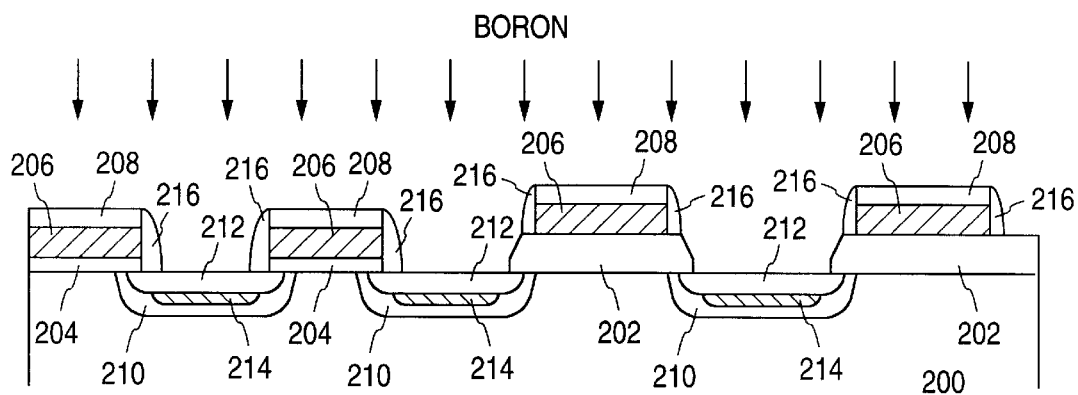
Figure 2F:
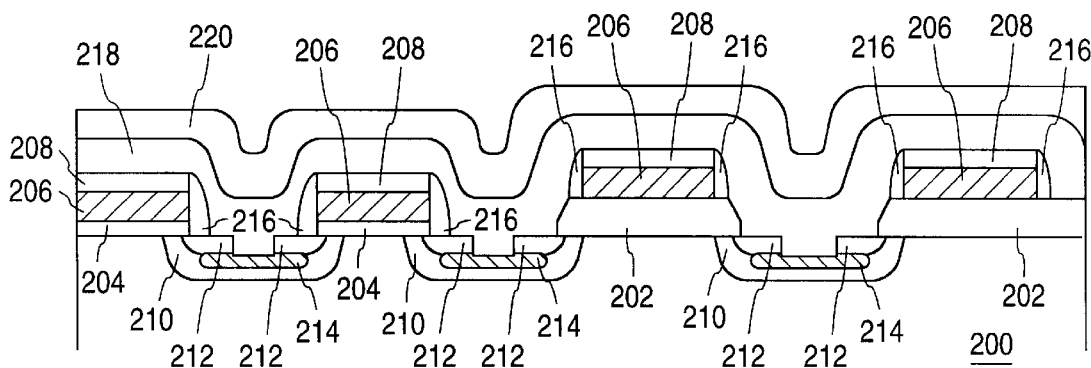

Referring to FIG. 2E, a layer of low temperature oxide (LTO) is then deposited and anisotropically etched to define oxide sidewall spacers 216 adjacent to the stacked poly structures. In accordance with the concepts of the present invention, a p-type punch-through stopper dopant is then symmetrically implanted to form p+ punch-through stopper regions 214 in the P-well regions beneath the n+ junction of the source regions 212. Typical impurity concentrations for the punch-through stopper implants 214 peak out at about $8 \times 10^{18}$ to $3 \times 10^{19}$ atoms per cubic centimeter. Preferably, the punch-through stopper dopant is boron introduced with an energy of about 140 KeV.

Figure 1A:
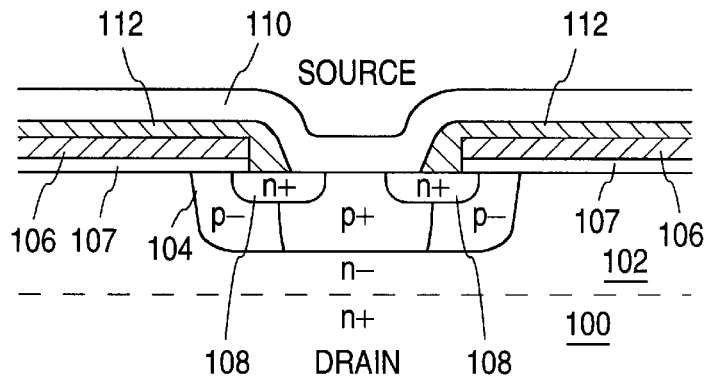
FIG. 1A is a cross-section drawing illustrating a conventional DMOS power device structure.
Figure 1B:
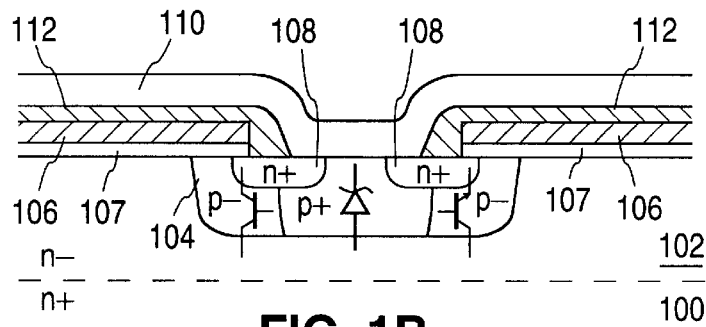
FIG. 1B is a cross-section drawing illustrating key parasitic elements in the FIG. 1A DMOS structure.
Figure 1C:
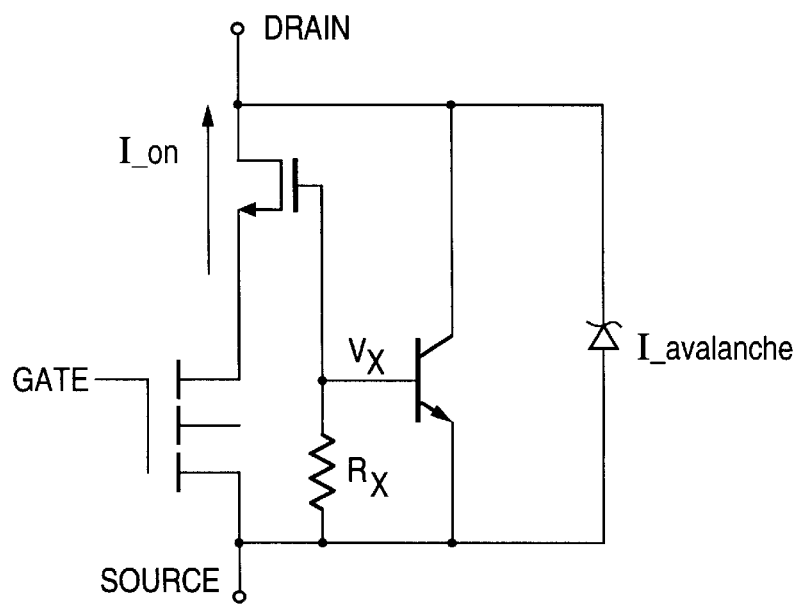
FIG. 1C is a schematic diagram illustrating a circuit equivalent of the FIG. 1A DMOS structure.

Following the punch through stopper implant described above, the process flow continues with formation of the source contacts. The source contacts can be formed as described above in conjunction with FIG. 1A utilizing a p+ implant to form the conventional heavy body region, followed by formation of an aluminum contact layer. In the preferred embodiment of the present invention, however, following the punch-through stopper implant, a photoresist mask is defined over the FIG. 2E structure to expose a central portion of the n+ source region 212. The mask is then utilized to anisotropically RIE etch through the n+ source region 212 to the punch-through stopper region 214 and, preferably, to the peak concentration of the punch-through stopper region 214. The mask is then stripped and a layer 218 of aluminum is deposited and etched to define an aluminum contact to the n+ source region 212 and to the punch-through stopper region 214. This is followed by deposition of an overlying layer 220 of passivating material, e.g. nitride, resulting in the structure shown in FIG. 2F.

Those skilled in the art will appreciate that the concepts of the invention can also be applied to p-channel DMOS devices. In one implementation of such a p-channel device, the n-type punch-through stopper implant comprises phosphorous implanted in a two step process: a first LDD implant to a peak concentration of about $8 \times 10^{14}$ atoms per cubic centimeter introduced at about 200–220 KeV and a second shallow implant to a peak concentration of about $5 \times 10^{15}$ atoms per cubic centimeter introduced at about 60 KeV.

Thus, the present invention provides an additional ion implant and thermal cycle to develop a punch-through stopper region of low resistivity within the BJT structure. The punch-through stopper region reduces both the ohmic drop due to current conduction and resulting lattice heating as a result of this conduction which jointly contribute to the latch up problem.

Figure 3:
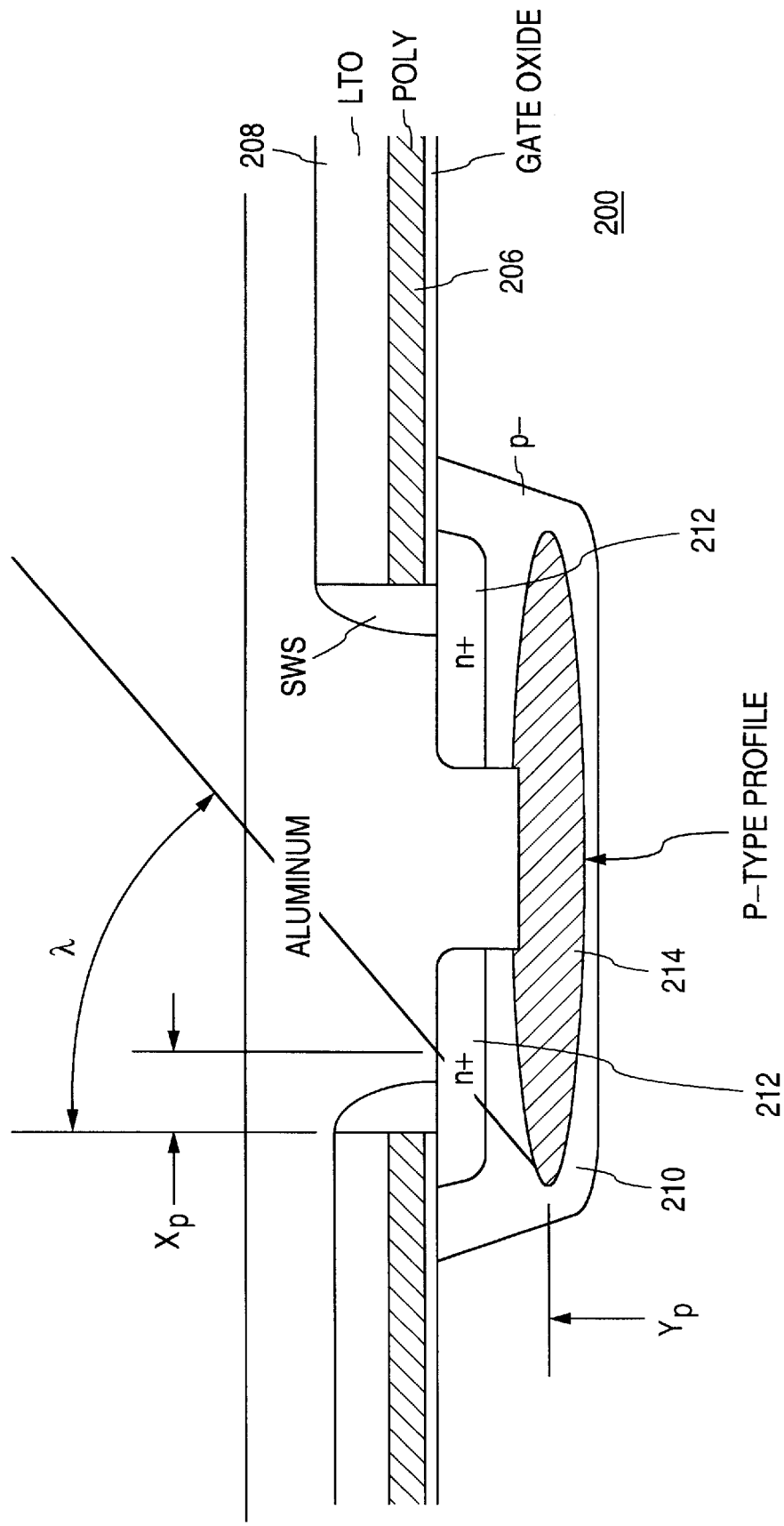
FIG. 3 is a cross-section drawing illustrating introduction of the dopant beam at an angle to the normal of the surface of the wafer, in accordance with the concepts of the present invention, together with the resulting dopant profile.

The nature of the implant is one which must be deep enough to fall beneath the shallow n+ junctions which form the source drain/drain regions of the device. An additional characteristic of the implant is one in which the dopant impurity beam is introduced at an angle to the normal of the surface of the wafer. The dopant beam, together with the resulting profile, is shown in FIG. 3.

Using both process and device simulation, it has been shown that utilization of the heavy body implant in accordance with the present invention, and as described above is effective in significantly reducing the possibility of parasitic device turn on. This structure also provides a means of suppressing punch-through breakdown, which can also lower the device's voltage rating.

It should be understood that various alternatives to the embodiment of the invention described herein may be employed in practicing the invention. For example, while the embodiment of the invention described above is directed to an N-channel device, those skilled in the art will appreciate that the concepts of the invention are also applicable to P-channel devices through a suitable change in ion species and other relevant process adjustments well known in the art. Those skilled in the art will also appreciate that the concepts of the invention apply to the case in which the substrate forms the drain terminal of the device, as well as to the case in which the "substrate" role is played by a buried layer in the IC substrate. It is intended that the following claims define the scope of the invention and that methods and structures within the scope of these claims and their equivalents be covered thereby.

What is claimed is:

1. Method of fabricating a p-channel DMOS power device in a silicon semiconductor substrate, the method comprising:

forming a gate oxide layer on the substrate;

forming a polysilicon layer on the gate oxide layer;

forming a silicon dioxide layer on the polysilicon layer;

etching the silicon dioxide layer, the polysilicon layer and the gate oxide layer to expose a portion of the substrate;

implanting an n-type dopant into the exposed portion of the substrate to form an n-type well region in the substrate;

implanting a p-type dopant into the n-type region to form a p-type source region in the p-type well region;

forming oxide sidewall spacers on sidewalls of the etched polysilicon layer;

performing a first implant to introduce phosphorus into the well region beneath the source region at a first depth at a peak concentration of about $8 \times 10^{14}$ atoms per cubic centimeter at about 200–220 KeV; and performing a second implant to introduce phosphorus into the well region at a second depth shallower than the first depth beneath the source region at a peak concentration of about $5 \times 10^{15}$ atoms per cubic centimeter at about 60 KeV.

* * * * *